United States Patent
Kim et al.

(10) Patent No.: US 8,421,534 B2
(45) Date of Patent: Apr. 16, 2013

(54) PREDISTORTER FOR COMPENSATING FOR NONLINEAR DISTORTION AND METHOD THEREOF

(75) Inventors: Young Hoon Kim, Daejeon (KR); Gweon Do Jo, Daejeon (KR); Kwang Chun Lee, Daejeon (KR)

(73) Assignee: Electronics and Telecommunication Research Institute, Daejeon (KR)

( * ) Notice: Subject to any disclaimer, the term of this patent is extended or adjusted under 35 U.S.C. 154(b) by 0 days.

(21) Appl. No.: 13/330,986

(22) Filed: Dec. 20, 2011

(65) Prior Publication Data
US 2012/0154040 A1   Jun. 21, 2012

(30) Foreign Application Priority Data

Dec. 21, 2010 (KR) .................. 10-2010-0131441

(51) Int. Cl.
*H03F 1/26* (2006.01)

(52) U.S. Cl.
USPC ......... 330/149; 330/136; 375/297; 455/114.3

(58) Field of Classification Search .......... 330/149, 330/136; 375/297; 455/114.3
See application file for complete search history.

(56) References Cited

U.S. PATENT DOCUMENTS

| | | | |
|---|---|---|---|
| 6,342,810 B1 * | 1/2002 | Wright et al. | 330/51 |
| 6,498,529 B1 | 12/2002 | Kim et al. | |
| 6,853,246 B2 * | 2/2005 | Bauder et al. | 330/149 |
| 7,194,043 B2 * | 3/2007 | Ma | 375/296 |
| 7,333,559 B2 * | 2/2008 | Song et al. | 375/296 |
| 7,415,252 B2 * | 8/2008 | Jelonnek | 455/114.3 |
| 7,577,211 B2 * | 8/2009 | Braithwaite | 375/296 |
| 7,746,167 B1 * | 6/2010 | Summerfield | 330/149 |

OTHER PUBLICATIONS

Changsoo Eun et al., A New Volterra Predistorter Based on the Indirect Learning Architecture, IEEE Transactions on Signal Processing, Jan. 1997, pp. 223-227, vol. 45, No. 1.

* cited by examiner

*Primary Examiner* — Patricia Nguyen
(74) *Attorney, Agent, or Firm* — William Park & Associates Ltd.

(57) ABSTRACT

The predistorter may include: a predistortion filter predistorting an input signal to provide an output signal; a predistortion output estimation unit estimating the characteristics of a nonlinear device based on a signal processed by the nonlinear device and the output signal, and calculating a desired output signal of the predistortion filter by using the estimated characteristics of the nonlinear device; and an adaptive algorithm driving unit comparing the output signal with the desired output signal to output an error as a comparison result, calculating a filter coefficient according to which the calculated error is minimized, and providing the calculated filter coefficient to the predistortion filter in order to update a filter coefficient of the predistortion filter.

8 Claims, 2 Drawing Sheets

PREDISTORTER FOR COMPENSATING FOR NONLINEAR DISTORTION AND METHOD THEREOF

CROSS-REFERENCE TO RELATED APPLICATIONS

This application claims the priority of Korean Patent Application No. 10-2010-0131441 filed on Dec. 21, 2010, in the Korean Intellectual Property Office, the disclosure of which is incorporated herein by reference.

BACKGROUND OF THE INVENTION

1. Field of the Invention

The present invention relates to compensation for nonlinear distortion and, more particularly, to a predistorter for compensating for nonlinear distortion, applicable to a power amplifier and devices having various nonlinear characteristics, and a method for compensating for nonlinear distortion in a predistorter.

2. Description of the Related Art

Devices such as a power amplifier, an analog-to-digital converter (ADC), a digital-to-analog converter (DAC), or the like, of a base station or a mobile terminal in a mobile communications system have nonlinear distortion characteristics. For example, it is desirous for a power amplifier of a base station or a mobile terminal to only amplify the amplitude of an input signal while maintaining the form of the input signal as it is, but if an input signal has a particular level or higher, the power amplifier operates in a saturation region, having nonlinear distortion characteristics, such that the input signal distorted, rather than being linearly amplified. The nonlinear distortion characteristics are major causes of degraded signal quality and data reliability.

Thus, linearization technologies have been developed in various forms to compensate for nonlinear distortion characteristics of an amplifier to ensure stable and high quality signal transmissions.

Typical linearization methods include a backoff method of operating an amplifier only in a linear region and a predistortion method of predistorting an input signal of a power amplifier in consideration of nonlinear characteristics of the power amplifier to linearize the input signal.

An amplifier, a typical nonlinear device, has characteristics in which efficiency and distortion are conflicting (or reciprocal). For example, a Class A type amplifier has a small nonlinear range, such that it has low distortion but poor efficiency. Namely, in order for the Class A type amplifier to perform amplification to have the same level as that of an amplifier having good efficiency, the amplifier must consume more power, so it may not be desirous to apply the Class A type amplifier to a mobile terminal using a battery as a power source.

A Class C type amplifier has efficiency superior to that of Class A type amplifier, but involves more nonlinear distortion. Thus, this amplifier should employ the backoff method to prevent nonlinear distortion, having shortcomings in that the amplifier should be designed to have an output capacity greater than an intended output. In order to solve this problem, preferably, a device having a predistortion function may be provided at a front stage of the amplifier.

Predistortion methods can be divided into two types: One is performing predistortion by using digital signal processing in a baseband, and the other is connecting an RF amplifier having nonlinear characteristics opposite to RF characteristics of a power amplifier in an RF band to a front stage of the power amplifier to predistort an input signal.

The baseband digital predistortion method is advantageous in that a signal can be easily processed. Among the baseband digital predistortion methods is a method of previously measuring nonlinear characteristics of an amplifier, configuring a look-up table corresponding to an inverse function of the measured nonlinear function, and performing digital predistortion with reference to the configured table. However, the method of performing predistortion by using the look-up table has a problem in which all data in the look-up table should be updated when the characteristics of the amplifier are changed.

Another method, which complements the shortcomings of the predistortion method using a look-up table, is modeling nonlinearity of an amplifier and updating a corresponding parameter when the characteristics of the amplifier are changed. Here, the methods of modeling nonlinearity of the amplifier include various methods, such as a method of using a polynomial, a method of using a volterra series, including even a memory effect, and the like.

In general, in the case of devices having nonlinearity, such as an amplifier or the like, the nonlinear characteristics thereof are changed over time and at varying temperatures, and unless predistortion is performed each time the nonlinear characteristics are changed, performance of the device for predistortion is degraded to again cause severe nonlinear distortion in a signal output from the amplifier.

In order to estimate nonlinear characteristics of an amplifier changing over time and according to an environment as mentioned above, a method for performing digital predistortion by using an adaptive algorithm is used.

According to the adaptive algorithm, a difference between an output signal from a predistortion filter implementing polynomial modeling and a desired output signal is regarded as an error, and the coefficient of the predistortion filter is changed to minimize errors. Even when the characteristics of an amplifier are changed over time or according to a specific environment, the predistorter continues to update the coefficient to perform predistortion, thereby compensating for the nonlinear distortion of the amplifier.

As mentioned above, in updating filter parameters of the predistorter by the adaptive algorithm, the parameters must be updated such that the error, i.e., the difference between the output signal from the predistortion device and the desired output signal, can be minimized. However, in actuality, there is no method for accurately recognizing the desired output signal with respect to the output device of the predistorter, it may be difficult to update the filter coefficients of the predistorter with the general adaptive algorithm.

Thus, in order to complement such shortcomings, an indirect learning structure and algorithm have been proposed. According to the indirect learning method, in order to obtain a desired predistorter output signal, a predistortion filter, which is the same as that of the predistorter, is installed in a portion to which an output from an amplifier is fed back, and an output from the predistorter using the same filter as that of the filter is regarded as a desired output signal and adaptive, whereby the predistorter has an inverse function role in linearizing nonlinearity of the amplifier.

However, the indirect learning method is disadvantageous, in that the order of the filter is not accurately used in the process of calculating and adapting an error by using the indirect method, without actually using a desired predistorter output signal, and when the distortion of the amplifier is severe, performance may be degraded.

In order to complement the shortcomings, a method of implementing a predistorter by expressing an input signal of a predistorter, the coefficient of an estimated amplifier, and a present and past signal of the predistorter by modeling nonlinear characteristics of an amplifier, estimating the coefficients, and changing an input/output relational expression of the amplifier, rather than indirectly adapting the predistorter, has been introduced. This method, however, has shortcomings in that linearization performance is not guaranteed in a range in which nonlinearity is severe. Namely, there is a problem in which a backoff level must be more severely adapted in comparison to the indirect learning method.

SUMMARY OF THE INVENTION

An aspect of the present invention provides a predistorter capable of stably compensating for nonlinear characteristics, even when nonlinear characteristics of a nonlinear device are changed.

Another aspect of the present invention is to provide a method for compensating for nonlinear characteristics of a predistorter.

According to an aspect of the present invention, there is provided a predistorter including: a predistortion filter predistorting an input signal u(n) by using a filter modeled by using the input signal u(n) and a past value of the input signal u(n) to provide an output signal x(n); a predistortion output estimation unit estimating the characteristics of a nonlinear device based on a signal y(n), processed by the nonlinear device and the output signal x(n), and calculating a desired output signal z(n) of the predistortion filter by using the estimated characteristics of the nonlinear device; and an adaptive algorithm driving unit comparing the output signal x(n) with the desired output signal z(n) to output an error as a comparison result, calculating a filter coefficient according to which the calculated error is minimized, and providing the calculated filter coefficient to the predistortion filter in order to update a filter coefficient of the predistortion filter.

The predistortion filter may predistort the input signal u(n) by using the Equation shown below, and provide the output signal x(n).

$$x(n) = g(u(n)) = \sum_{m=0}^{M-1} \beta_m^b(|u(n-m)|)u(n-m)$$

$$= \sum_{m=0}^{M-1} \left\{ \sum_{k=1}^{P} b_{mk}(n)|u(n-m)|^{k-1} \right\} u(n-m)$$

wherein P is polynomial order, M is a maximum delay value of a sampling unit, and $b_{mk}(n)$ is a filter coefficient.

The signal y(n) processed by the nonlinear device may be modeled by using the output signal x(n) and a past value of the output signal x(n).

The signal y(n) processed by the nonlinear device may be modeled by using the Equation shown below:

$$y(n) = f(x(n)) = \sum_{m=0}^{M-1} \beta_m^c(|x(n-m)|)x(n-m)$$

-continued $$= \sum_{m=1}^{M-1} \left\{ \sum_{k=1}^{Q} c_{mk}(n)|x(n-m)|^{k-1} \right\} x(n-m)$$

wherein Q is polynomial order, M is a maximum delay value of a sampling unit, and $c_{mk}(n)$ is modeling characteristics of the nonlinear device at time n.

The predistortion output estimation unit may estimate the modeling characteristics $c_{mk}(n)$ of the nonlinear device and calculate the desired output signal z(n) of the predistortion filter by using the Equation shown below:

$$z(n) = \hat{x}(n) = \frac{1}{\beta_0^c(|x(n)|)} \left\{ u(n) - \sum_{m=0}^{M-1} \beta_m^c(|x(n-m)|)x(n-m) \right\}$$

According to another aspect of the present invention, there is provided a predistortion method including: predistorting an input signal u(n) by using a predistortion filter modeled by using the input signal u(n) and a past value of the input signal u(n), to output an output signal x(n); calculating a desired output signal z(n) of the predistortion filter based on the signal y(n) processed by a predistorter and the output signal x(n); comparing the output signal x(n) with the desired output signal z(n) to output an error as a comparison result; calculating a filter coefficient according to which the calculated error is minimized; and updating a filter coefficient of the predistortion filter by using the calculated filter coefficient.

BRIEF DESCRIPTION OF THE DRAWINGS

The above and other aspects, features and other advantages of the present invention will be more clearly understood from the following detailed description taken in conjunction with the accompanying drawings, in which.

DETAILED DESCRIPTION OF THE PREFERRED EMBODIMENT

Figure 1:
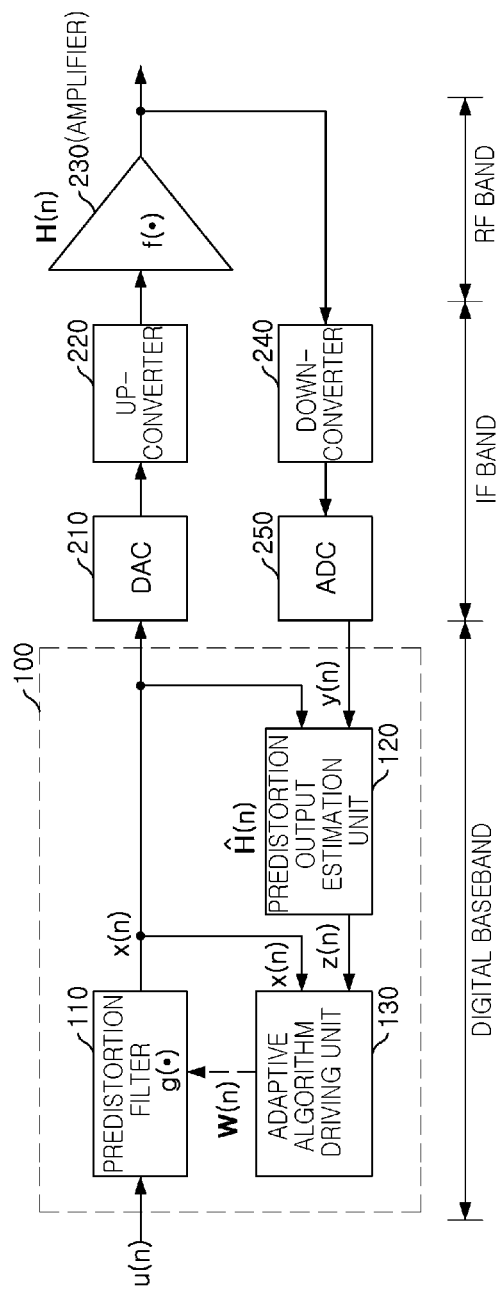
FIG. 1 is a schematic block diagram showing the configuration of a predistorter for compensating for nonlinear distortion according to an embodiment of the present invention.

The present invention may be modified variably and may have various embodiments, particular examples of which will be illustrated in drawings and described in detail.

However, it should be understood that the following exemplifying description of the invention is not intended to restrict the invention to specific forms thereof, but rather, the present invention is meant to cover all modifications, similarities and alternatives which are included in the spirit and scope of the present invention.

While terms such as "first" and "second," etc., may be used to describe various components, such components must not be understood as being limited to the above terms. The above terms are used only to distinguish one component from another. For example, a first component may be referred to as a second component without departing from the scope of rights of the present invention, and likewise a second component may be referred to as a first component. The term "and/ or" encompasses both combinations of the plurality of related items disclosed and any item from among the plurality of related items disclosed.

When a component is mentioned as being "connected" to or "accessing" another component, this may mean that it is directly connected to or accessing the other component, but it is to be understood that another component may exist therebetween. On the other hand, when a component is mentioned as being "directly connected" to or "directly accessing" another component, it is to be understood that there are no other components in-between.

The terms used in the present application are merely used to describe particular embodiments, and are not intended to limit the present invention. An expression used in the singular encompasses the expression of the plural, unless it has a clearly different meaning in the context in which it is used. In the present application, it is to be understood that terms such as "including" or "having," etc., are intended to indicate the existence of the features, numbers, operations, actions, components, parts, or combinations thereof disclosed in the specification, and are not intended to preclude the possibility that one or more other features, numbers, operations, actions, components, parts, or combinations thereof may exist or may be added.

Unless otherwise defined, all terms used herein, including technical or scientific terms, have the same meanings as those generally understood by those with ordinary knowledge in the field of art to which the present invention belongs. Such terms as those defined in a generally used dictionary are to be interpreted as having meanings equal to the contextual meanings in the relevant field of art, and are not to be interpreted as having ideal or excessively formal meanings unless clearly defined as having such in the present application.

Embodiments of the present invention will be described below in detail with reference to the accompanying drawings, where those components that are the same or are in correspondence are rendered using the same reference number, regardless of the figure number, and redundant explanations are omitted.

FIG. 1 is a schematic block diagram showing the configuration of a predistorter for compensating for nonlinear distortion according to an embodiment of the present invention.

In FIG. 1, it is illustrated that a predistorter 100 using an adaptive algorithm is applied to a transmission unit of a mobile communication system including a power amplifier 230. The predistorter 100 performs predistortion in a digital baseband range.

With reference to FIG. 1, the predistorter 100 includes a predistortion filter 110, a predistortion output estimation unit 120, and an adaptive algorithm driving unit 130. The predistorter 100 performs predistortion in consideration of all of nonlinear characteristics of a digital-to-analog converter (DAC) 210, an up-converter 220, a down-converter 240, and an analog-to-digital converter (ADC) 250, as well as the power amplifier 230 of a mobile communication system.

The power amplifier 230 of a mobile communication system illustrated in FIG. 1 is a typical nonlinear device, which can be modeled as a nonlinear function $f(\cdot)$. Also, an input/output relationship of the power amplifier 230 can be expressed by a digital baseband equivalent relational expression expressed by Equation 1 shown below:

$$y(n) = f(x(n)) = \sum_{m=0}^{M-1} \beta_m^c(|x(n-m)|)x(n-m) \quad \text{[Equation 1]}$$

$$= \sum_{m=0}^{M-1} \left\{ \sum_{k=1}^{Q} c_{mk}(n)|x(n-m)|^{k-1} \right\} x(n-m)$$

$$= [c_{01} \ldots c_{(M-1)1} \ldots c_{0Q} \ldots c_{(M-1)Q}]$$

$$\begin{bmatrix} x(n) \\ \vdots \\ x(n-M-1) \\ \vdots \\ |x(n)|^{Q-1}x(n) \\ \vdots \\ |x(n-M-1)|^{Q-1}x(n-M-1) \end{bmatrix}$$

$$= H(n)^H \cdot X(n).$$

In Equation 1, Q is polynomial order, M is a maximum delay value of a sampling unit, $c_{mk}(n)$ is a parameter indicating modeling characteristics of the power amplifier 230 at time n.

As expressed in Equation 1, a digital baseband equivalent output signal y(n) is modeled by using a function of an output signal x(n) of the predistortion filter 110 and a past value of the output signal x(n).

Also, as expressed in Equation 2, the output signal x(n) from the predistortion filter 110 may be modeled by using an input signal u(n) of the predistortion filter 110 and a past value of the input signal u(n).

$$x(n) = g(u(n)) = \sum_{m=0}^{M-1} \beta_m^b(|u(n-m)|)u(n-m) \quad \text{[Equation 2]}$$

$$= \sum_{m=0}^{M-1} \left\{ \sum_{k=1}^{P} b_{mk}(n)|u(n-m)|^{k-1} \right\} u(n-m)$$

$$= [b_{01} \ldots b_{(M-1)1} \ldots b_{0P} \ldots b_{(M-1)P}]$$

$$\begin{bmatrix} u(n) \\ \vdots \\ u(n-M-1) \\ \vdots \\ |u(n)|^{P-1}u(n) \\ \vdots \\ |u(n-M-1)|^{P-1}u(n-M-1) \end{bmatrix}$$

$$= W(n)^H \cdot U(n)$$

In Equation 2, P is polynomial order, M is a maximum delay value of a sampling unit, and $b_{mk}(n)$ is a coefficient of the polynomial or a filter coefficient of the predistortion filter 110.

As expressed in Equation 2, the predistortion filter 110 provides an output signal x(n) obtained by predistorting the input signal u(n) by using the filter coefficient $b_{mk}(n)$ (or W(n)).

The filter coefficient $b_{mk}(n)$ (or W(n)) is calculated by the adaptive algorithm driving unit 130 and provided to the predistortion filter 110, so as to be reflected when a filter coefficient is required to be updated.

The predistortion output estimation unit 120 receives the output signal y(n) from the power amplifier 230 and the output signal x(n) from the predistortion filter 110, as input signals, estimates digital baseband equivalent characteristics ĉ$_{mk}$ of the power amplifier 230, and calculates the desired output signal z(n) of the predistortion filter 110 by using the estimated digital baseband equivalent characteristics ĉ$_{mk}$, as expressed in Equation 3 shown below:

$$z(n) = \hat{x}(n) = \frac{1}{\beta_0^c(|x(n)|)}\left\{u(n) - \sum_{m=0}^{M-1}\beta_m^c(|x(n-m)|)x(n-m)\right\}$$ [Equation 3]

In the process of calculating the desired output signal z(n) through Equation 3, in the beginning, the desired output signal x̂(n) is estimated by using |u(n)| instead of |x(n)| of $\beta_0^c(|x(n)|)$, but when Equation 3 is repeated several times, it converges into an inverse function of the function exhibiting the characteristics of the power amplifier as expressed by Equation 4 shown below:

$$\hat{x}(n) = f^{-1}(y(n))$$ [Equation 4]

The output signal z(n) of the predistortion output estimation unit 120 expressed in Equation 4 is provided to the adaptive algorithm driving unit 130 so as to be used as a desired output signal of the predistortion filter 110.

The adaptive algorithm driving unit 130 compares the output signal x(n) from the predistortion filter 110 with the output signal z(n) from the predistortion output estimation unit 120 to calculate an error as a comparison result, calculates a filter coefficient W(n) of the predistortion filter 110 by applying a least mean square (LMS), a recursive least mean square (RLS), or the like, to the calculated error and provides the calculated filter coefficient to the predistortion filter 110, to allow the filter coefficient b$_{mk}$(n) of the predistortion filter 110 to be updated.

In FIG. 1, the output signal x(n) obtained by predistorting the input signal u(n) by the predistortion filter 110 is converted into an analog signal by the DAC 210, converted into an intermediate frequency (IF) signal by the up-converter 220, power-amplified by the power amplifier 230, and then, transmitted through an antenna (not shown).

Also, the signal amplified by the power amplifier 230 is converted into the digital baseband signal y(n) through the down-converter 240 and the ADC 250 and provided to the predistortion output estimation unit 120, so as to be used to estimate the desired output signal z(n).

In the mobile communication system including the predistorter 100, the predistorter 100 performs predistortion in consideration of all of the nonlinear characteristics of the DAC 210, the up-converter 220, the down-converter 240, and the ADC 250, as well as the nonlinear characteristics of the power amplifier 230.

Figure 2:
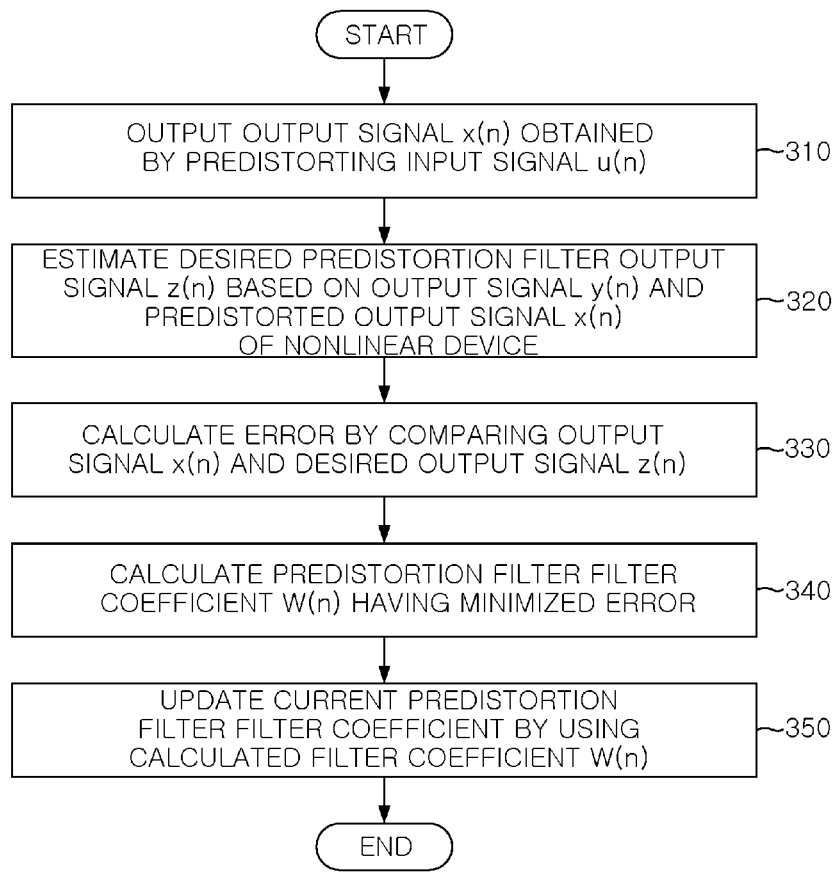
FIG. 2 is a flow chart illustrating the process of a predistortion method for compensating for nonlinear distortion according to an embodiment of the present invention.

FIG. 2 is a flow chart illustrating the process of a predistortion method for compensating for nonlinear distortion according to an embodiment of the present invention, which shows the predistortion process performed by the predistorter 100 illustrated in FIG. 1.

With reference to FIG. 2, first, the predistorter generates an output signal x(n) obtained by predistorting the predistortion input signal u(n) by using the function modeled by using the predistortion input signal u(n) and a past value of the input signal as expressed by Equation 2 (step 310).

Next, the predistorter estimates the desired output signal z(n) of the predistortion filter as expressed by Equation 3 by using the output signal y(n) obtained by processing the output signal x(n) by a nonlinear device such as a power amplifier, or the like, and the predistorted output signal x(n) (S320). Here, the estimated desired output signal z(n) may be estimated by using an inverse function of a function obtained by modeling the characteristics of the nonlinear device (e.g., amplifier) as expressed by Equation 4.

In order to estimate the desired output signal z(n) of the predistortion filter as mentioned above, first, modeling of the nonlinear characteristics of the nonlinear device such as an amplifier, or the like, is required. Here, the nonlinear characteristics of the nonlinear device may be modeled as the function of the predistorted output signal x(n) and a past value of the output signal x(n) as expressed by Equation 1.

And then, the predistorter compares the output signal x(n) and the desired output signal z(n) to calculate an error (step 330).

The predistorter calculates a filter coefficient W(n) of the predistortion filter according to which the error is minimized by applying a least mean square (LMS) or a recursive least mean square (RLS) to the calculated error, and provides the calculated filter coefficient to the predistortion filter 110 (step 340), and updates a current filter coefficient of the predistortion filter by using the calculated filter coefficient W(n) (step 350).

As shown in FIGS. 1 and 2, in the predistorter for compensating for nonlinear distortion and a method thereof according to embodiments of the invention, nonlinear characteristics of device, such as a power amplifier, or the like, having nonlinear distortion characteristics, are modeled in real time, a desired output signal of a predistortion filter is estimated based on a modeled signal and a predistorted output signal, and a filter coefficient for minimizing an error corresponding to the difference between the estimated desired output signal and an output signal from the predistortion filter, and a filter coefficient of the predistortion filter is updated with the calculated filter coefficient.

Thus, even when the nonlinear distortion characteristics of the nonlinear device are changed in real time over time and at varying temperatures, the filter coefficient can be continually updated by applying a corresponding adaptive algorithm, to thereby stably compensate for the nonlinear distortion characteristics.

As set forth above, according to embodiments of the invention, nonlinear characteristics of a device, such as a power amplifier, or the like, having nonlinear distortion characteristics, are modeled in real time, a desired output signal of a predistortion filter is estimated based on a modeled signal and a predistorted output signal, and a filter coefficient for minimizing an error corresponding to the difference between the estimated desired output signal and an output signal from the predistortion filter, and a filter coefficient of the predistortion filter is updated with the calculated filter coefficient.

Accordingly, although the nonlinear characteristics of the nonlinear device may be changed over time or according to an environment, the nonlinear characteristics can be stably compensated for.

While the present invention has been shown and described in connection with the embodiments, it will be apparent to those skilled in the art that modifications and variations can be made without departing from the spirit and scope of the invention as defined by the appended claims.

What is claimed is:

1. A predistorter comprising:
   a predistortion filter predistorting an input signal u(n) by using a filter modeled by using the input signal u(n) and a past value of the input signal u(n) to provide an output signal x(n);
   a predistortion output estimation unit estimating the characteristics of a nonlinear device based on a signal y(n), processed by the nonlinear device and the output signal x(n), and calculating a desired output signal z(n) of the predistortion filter by using the estimated characteristics of the nonlinear device; and an adaptive algorithm driving unit comparing the output signal x(n) with the desired output signal z(n) to output an error as a comparison result, calculating a filter coefficient according to which the calculated error is minimized, and providing the calculated filter coefficient to the predistortion filter in order to update a filter coefficient of the predistortion filter.

2. The predistorter of claim 1, wherein the predistortion filter predistorts the input signal u(n) by using the Equation shown below, and provides the output signal x(n), $$x(n) = g(u(n)) = \sum_{m=0}^{M-1} \beta_m^b(|u(n-m)|)u(n-m)$$

$$= \sum_{m=0}^{M-1} \left\{ \sum_{k=1}^{P} b_{mk}(n)|u(n-m)|^{k-1} \right\} u(n-m)$$

wherein P is polynomial order, M is a maximum delay value of a sampling unit, and $b_{mk}(n)$ is a filter coefficient.

3. The predistorter of claim 1, wherein the signal y(n) processed by the nonlinear device is modeled by using the output signal x(n) and a past value of the output signal x(n).

4. The predistorter of claim 3, wherein the signal y(n) processed by the nonlinear device is modeled by using the Equation shown below:

$$y(n) = f(x(n)) = \sum_{m=0}^{M-1} \beta_m^c(|x(n-m)|)x(n-m)$$

$$= \sum_{m=0}^{M-1} \left\{ \sum_{k=1}^{Q} c_{mk}(n)|x(n-m)|^{k-1} \right\} x(n-m)$$

wherein Q is polynomial order, M is a maximum delay value of a sampling unit, and $c_{mk}(n)$ is modeling characteristics of the nonlinear device at time n.

5. The predistorter of claim 4, wherein the predistortion output estimation unit estimates the modeling characteristics $c_{mk}(n)$ of the nonlinear device and calculates the desired output signal z(n) of the predistortion filter by using the Equation shown below:

$$z(n) = \hat{x}(n) = \frac{1}{\beta_0^c(|x(n)|)} \left\{ u(n) - \sum_{m=0}^{M-1} \beta_m^c(|x(n-m)|)x(n-m) \right\}.$$

6. A predistortion method comprising:

predistorting an input signal u(n) by using a predistortion filter modeled by the input signal u(n) and a past value of the input signal u(n), to output an output signal x(n);

calculating a desired output signal z(n) of the predistortion filter based on the signal y(n) processed by a nonlinear device and the output signal x(n);

comparing the output signal x(n) with the desired output signal z(n) to output an error as a comparison result;

calculating a filter coefficient according to which the calculated error is minimized; and updating a filter coefficient of the predistortion filter by using the calculated filter coefficient.

7. The method of claim 6, wherein the signal y(n) processed by the nonlinear device is modeled by using the Equation shown below:

$$y(n) = f(x(n)) = \sum_{m=0}^{M-1} \beta_m^c(|x(n-m)|)x(n-m)$$

$$= \sum_{m=0}^{M-1} \left\{ \sum_{k=1}^{Q} c_{mk}(n)|x(n-m)|^{k-1} \right\} x(n-m)$$

wherein Q is polynomial order, M is a maximum delay value of a sampling unit, and $c_{mk}(n)$ is modeling characteristics of the nonlinear device at time n.

8. The method of claim 7, wherein, in calculating the desired output signal z(n) of the predistortion filter, the modeling characteristics $c_{mk}(n)$ of the nonlinear device are estimated, and the desired output signal z(n) of the predistortion filter is calculated by using the Equation shown below:

$$z(n) = \hat{x}(n) = \frac{1}{\beta_0^c(|x(n)|)} \left\{ u(n) - \sum_{m=0}^{M-1} \beta_m^c(|x(n-m)|)x(n-m) \right\}.$$

* * * * *